United States Patent
Urabe

[19]

[11] Patent Number: 5,952,844
[45] Date of Patent: Sep. 14, 1999

[54] APPARATUS FOR TESTING SEMICONDUCTOR IC (INTEGRATED CIRCUIT)

[75] Inventor: Ryo Urabe, Tokyo, Japan

[73] Assignee: NEC Corporation, Japan

[21] Appl. No.: 08/926,368

[22] Filed: Sep. 9, 1997

[30] Foreign Application Priority Data

Sep. 13, 1996 [JP] Japan .................................. 8-243622

[51] Int. Cl.$^6$ .................................................. G01R 31/26
[52] U.S. Cl. .......................................... 324/765; 324/769
[58] Field of Search ................................. 324/765, 766, 324/769

[56] References Cited

U.S. PATENT DOCUMENTS 5,270,643  12/1993  Richardson et al. ...................... 324/751
5,473,259  12/1995  Takeda ...................................... 324/760
5,493,208  2/1996   Goto ......................................... 324/73.1

FOREIGN PATENT DOCUMENTS 4279874  10/1992  Japan .

Primary Examiner—Glenn W. Brown
Attorney, Agent, or Firm—Hayes, Soloway, Hennessey, Grossman & Hage, P.C.

[57] ABSTRACT

An apparatus for testing a semiconductor IC, comprises electronic circuits in a number corresponding to the number of terminals of a memory to be tested. The electronic circuits each comprise a set of a waveform generator, a strobing pulse generator, and a logic comparator, the electronic circuit being a CMOS type LSI, wherein logic operation circuits in a semiconductor chip constituting a LSI and thermal control circuits are paired. The power consumption of the thermal control circuits is regulated by the output operation frequency of each of the logic operation circuits, the sum of the heating value of each of the logic operation circuits and the heating value of the thermal control circuits paired with the logic operation circuits are made constant, permitting timing accuracy to be stabilized independently of test frequency and test pattern.

4 Claims, 6 Drawing Sheets

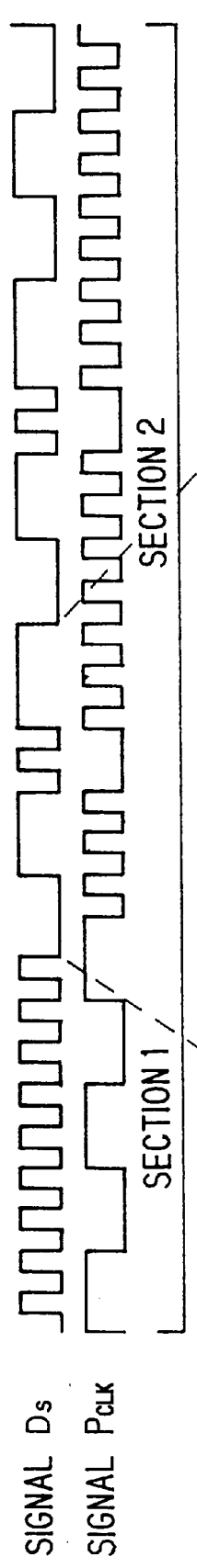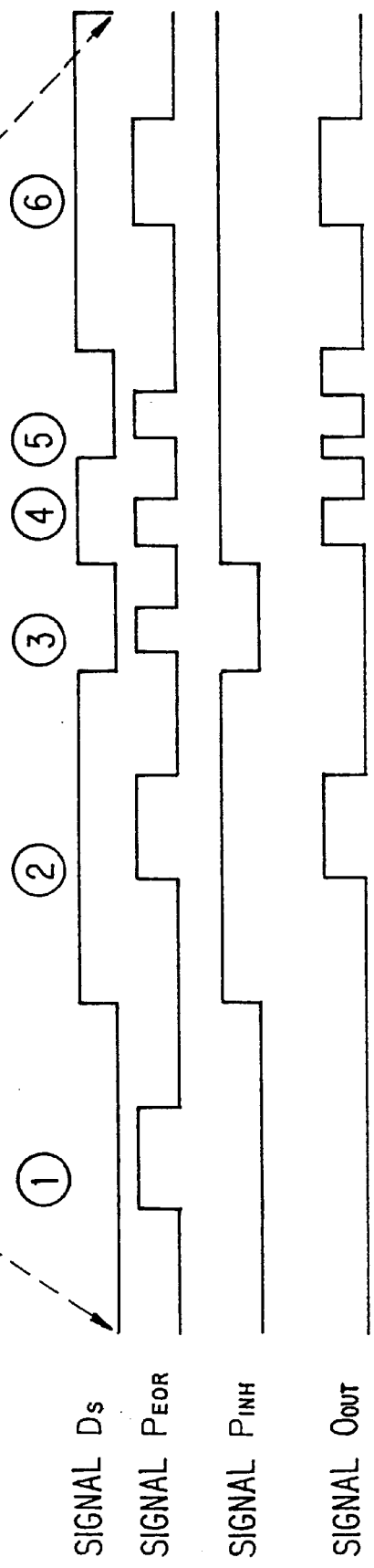
FIG.2A PRIOR ART
FIG.2B PRIOR ART

SOLID LINE : CONSUMED POWER OF LOGIC OPERATION CIRCUIT 11a
BROKEN LINE : CONSUMED POWER OF THERMAL CONTROL CIRCUIT 13a

HATCHED REGION:
FUNCTIONAL BLOCK A

VOID REGION:
THERMAL CONTROL
CIRCUIT B

HATCHED REGION:
FUNCTIONAL BLOCK A

VOID REGION:
THERMAL CONTROL
CIRCUIT B

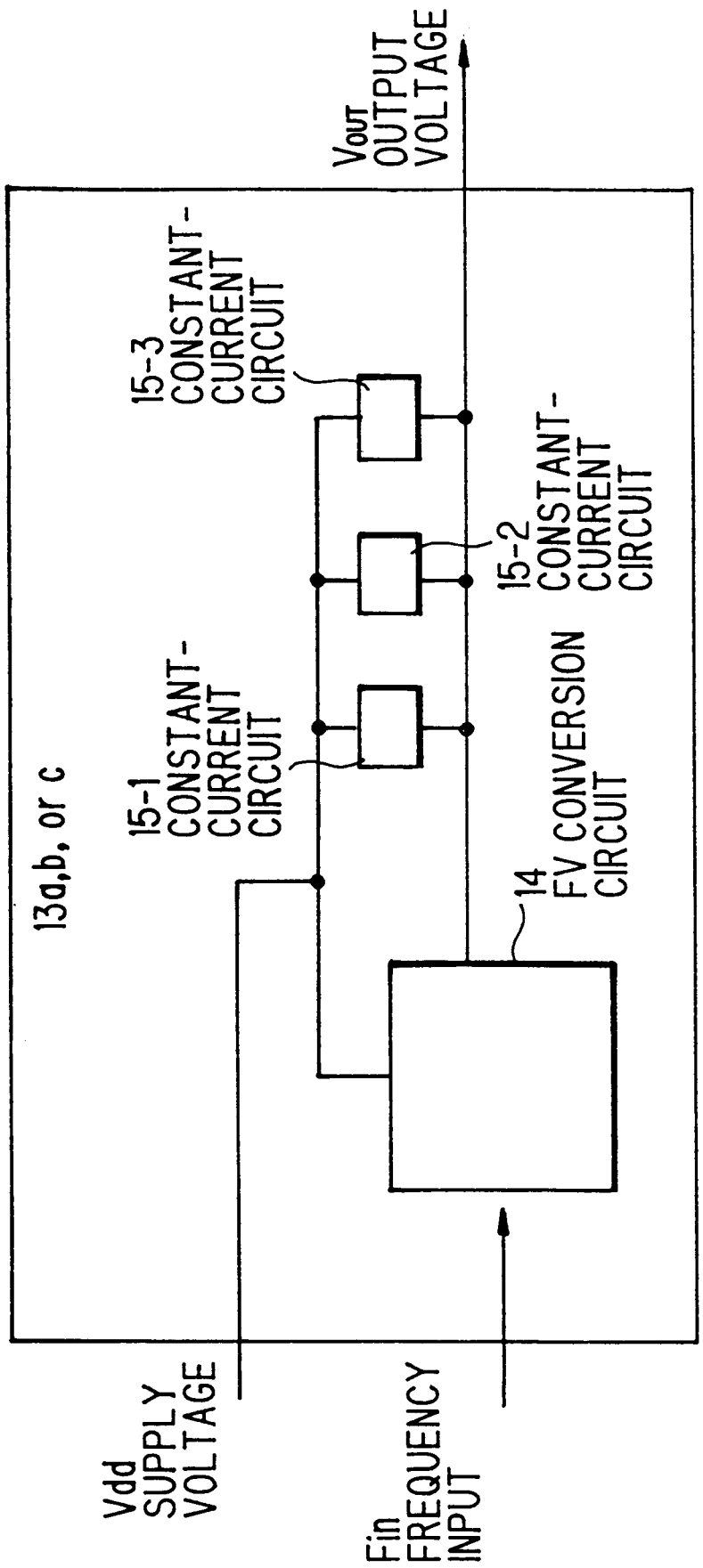

APPARATUS FOR TESTING SEMICONDUCTOR IC (INTEGRATED CIRCUIT)

FIELD OF THE INVENTION

The present invention relates to an apparatus for testing a semiconductor IC and in-particular to a semiconductor IC test apparatus for testing semiconductor memories and the like (hereinafter referred to as a "test apparatus").

BACKGROUND OF THE INVENTION

A conventional test apparatus will be explained with reference to accompanying drawings. FIG. 1 is a block diagram of a conventional test apparatus for a semiconductor IC for testing semiconductor memories.

The conventional test apparatus comprises: a timing generator 1 for generating timing of a signal for testing a memory 5 under test (hereinafter referred to as "IC under test"); a pattern generator 2 for generating a test pattern, for testing the IC 5 under test, utilizing as an input the timing signal from the timing generator 1; a waveform generator 3 for forming a waveform utilizing as an input the timing signal from the timing generator 1 and the pattern signal from the pattern generator 2; a drive circuit 4 for converting the signal generated in the waveform generator 3 to a voltage; an IC 5 under test which is tested by inputting a signal driven by the drive circuit 4; a signal integration circuit 7 for receiving a signal output from the IC 5 under test and conducting level comparison with an expected value (not shown) utilizing an STRB signal generated by a strobing pulse generator 6 based on the timing signal generated in the timing generator 1; and a logic comparator 8 for conducting logic comparison of a comparison result signal generated in the signal integration circuit 7 with an expected value pattern signal generated in the waveform generator 3 and making a judgement such that, when both the logics agree with each other, the IC is acceptable while, when both the logics disagree with each other, the IC is unacceptable.

In the above test apparatus, an increase in speed and capacity of the IC 5 under test has led to a demand for high speed operation, high timing accuracy, and high processing capability. This test apparatus comprises electronic circuits each comprising a set of a waveform generator 3, a strobing pulse generator 6, and a logic comparator 8, the electronic circuit being constituted by an LSI and provided in a number corresponding to the number of terminals of the IC 5 under test. For example, the above electronic circuit comprises an ECL-G/A which can be operated at ultrahigh speed and of which the delay time is less dependent upon the temperature.

An ECL-G/A, however, for reasons of a small number of gates, large amount power consumption, high cost and the like, had led to drawbacks such as increased cost of the apparatus, increased power consumption of the apparatus, and increased size of the apparatus.

In order to eliminate the above drawbacks, an attempt has been made to adopt CMOS type LSI. For example, a CMOS-G/A is advantageous in that it has many gates (several M gates), low power consumption (about several W), and low cost. On the other hand, in the case of a CMOS-G/A, most of the power consumption is determined by a charge and discharge current for the load capacity, that is, by the product of the load capacity by the operation frequency, causing the ambient temperature of a CMOS-G/A to vary with a change in the operation frequency. For example, since the on-state resistance of the transistor is varied to vary the rise time of the signal, the transmission delay time is likely to become unstable, disadvantageously making it difficult to ensure timing accuracy.

In the test of an IC under test, varying the test operation frequency is unavoidable and, hence, renders the transmission delay time unstable, making it impossible to ensure the timing accuracy, which is a serious problem.

Japanese Patent Laid-Open No. 279874/1992 discloses a technique for solving the above problem using CMOS-G/A. In the technique disclosed in Japanese Patent Laid-Open No. 279874/1992, a dummy circuit is provided in a chip of an LSI constituting a waveform generator and a strobing pulse generator, and this dummy circuit is constructed so as to operate at a frequency which differentially varies relative to the operation frequency of the waveform generator and the strobing pulse generator. Since the waveform generator and the strobing pulse generator and the dummy circuit are operated by signals which are mutually differentially varied, the sum of both the power consumption can be made constant.

Therefore, the temperature of the LSI chip can be always kept constant independently of a change in operation speed, making it possible to avoid a change in delay time, In the technique disclosed in Japanese Patent Laid-Open No. 279874/1992, a differentially varied signal $P_{CLK}$ may be as shown in FIG. 2A. Specifically, a timing signal $D_B$ is a timing signal which is fed to the waveform generator 3, the strobing pulse generator 6, and the logic comparator 8, and the timing signal $P_{CLK}$ is a signal which is fed to the dummy circuit, the frequency of the signal being differentially varied depending upon the frequency of the timing signal $D_B$.

The value of the differentially varied frequency should be previously described as a part of a test program after a complex calculation involving a test pattern. Alternatively, the test apparatus should be loaded with a complex computing circuit to automatically provide the differentially varied frequency.

An increase in complexity of the function of the IC 5 under test has lead to an increase in complexity of the waveform generated, for example, in the waveform generator 3.

Drawbacks of the technique disclosed in Japanese Patent Laid-Open No. 279874/1992 will be described with reference to FIG. 2B showing an example of operation of a waveform generator. FIG. 2B is a diagram showing any given enlarged section of the test pattern shown in FIG. 2A.

A signal $D_B$ and a signal $P_{EOR}$ are timing signals in the timing generator 1, a signal $P_{INK}$ a pattern signal in the pattern generator 2, and a signal $O_{OUT}$ a signal output from the waveform generator 3 and input into the drive circuit 4. In the drawing, each of numerals ① to ⑥ represents one clock cycle.

In the example shown in the drawing, the signal $D_B$ is set by two sets of timing preset values, one set consisting of values, ①, ② and ⑥ with the other set consisting of values ③, ④ and ⑤. Thus, a plurality of timing preset values can be set in clock cycles.

A signal $P_{EOR}$ is a signal which conducts exclusive "OR" operation of the waveform of the signal $D_S$ add qualification, and a signal $P_{INH}$ is a signal which further ANDs the results of the above logical operation.

$$O_{OUT} = (D_s \underline{FOR} P_{EOR}) \underline{AND} P_{INH} \quad (1)$$

∠ underlined is a logical operation sign.

According to "Gate Array," a data book published by NEC Corp., the consumed power of a CMOS6/6A family is calculated, for example, by the following equation 2.

$$\text{Total consumed power } P_D = \Sigma P_{DCELL} + \Sigma P_{DI} + \Sigma P_{DO} \quad (2)$$

wherein $\Sigma P_{DCELL}$=consumed power of internal cell ($\mu$W)= $\Sigma(8*f*\text{Cell}*A)$ . . . A: constant $\Sigma P_{DI}$=consumed power of input buffer ($\mu$W)=$\Sigma(46*f*\text{Buffer})$ $\Sigma P_{DO}$=consumed power of output buffer (mW)=$\Sigma(0.23+0.016(Cl+34)*f+\text{Pconst})*\text{Buffer})$ wherein f: operation frequency (Mhz)

Cl: load capacity (pF), and

Pconst: steady-state consumed power.

As described above, most of the consumed power of a CMOS-G/A is a charge and discharge current for a load capacity during operation. The approximate consumed power is determined by the load capacity and the operation frequency.

In this case, for the signal $D_B$ shown in FIG. 2, three charges and three discharges are performed in ①–②, ③–④, and ⑤–⑥. On the other hand, the signal $O_{OUT}$ performs six discharges and five charges in close relationship with the signal $P_{INH}$.

Thus, the relationship between the signal $D_B$ and the signal $O_{OUT}$ is in close relationship with the equation 1 determined by the test problem. Further, the consumed power of $\Sigma P_{D0}$ output buffer is greatly influenced by the operation frequency of the signal $O_{OUT}$ and the number of output buffers and occupies a large proportion of the total consumed power.

Therefore, the technique disclosed in Japanese Patent Laid-Open No. 279874/1992, that is, the technique wherein "when the frequency of the timing signal $D_B$ is changed from f1 to f2 (f1<f2), for example, the operation frequency of the signal $P_{CLK}$ given to the dummy circuit 9 constituted by gate arrays cascaded in a suitable number of stages is differentially changed from f2 to f1," has the following problem.

Specifically, the differentially varied signal $P_{CLK}$ is not determined by the frequency of the timing signal $D_B$ alone and should be in close relationship with the equation 1 determined by the test problem as in the signal $O_{OUT}$.

Further, in the technique disclosed in Japanese Patent Laid-Open No. 279874/1992, the circuit size of the dummy circuit is so large (30 to 50%) that the utilization efficiency of the gate array circuit is low.

Furthermore, the technique has a problem that in some arrangement of the dummy circuit, the heat balance is broken and the sum of power consumption cannot be made constant, resulting in unstable transmission delay time, which makes it impossible to ensure the timing accuracy.

SUMMARY OF THE INVENTION

Accordingly, an object of the present invention is to provide an apparatus for testing a semiconductor IC which, even when test conditions, including test frequency and test pattern, are varied, can stabilize and ensure the timing accuracy while reducing the cost, the consumed power and the size.

According to the invention, an apparatus for testing a semiconductor integrated circuit (IC), comprises:

CMOS type LSIs in a number corresponding to the number of terminals of the semiconductor IC, each said LSI having a waveform generator, a strobing pulse generator, and a logic comparator, at least one of the waveform generator, the strobing pulse generator, and the logic comparator being paired as a functional block with a thermal control circuit, the power consumption of the thermal control circuit being regulated by the output operating frequency of the functional block.

In the apparatus for testing a semiconductor integrated circuit, the thermal control circuit and the functional block may be laid out so that the thermal control circuit adjoins and surrounds the functional block in a box form.

Further, the thermal control circuit and the functional block may be laid out so that the thermal control circuit adjoins and surrounds the functional block in a comb form having a plurality of the sections and a constant-current circuit is provided in each tine section.

According to the present invention, each functional block within a semiconductor chip comprising an LSI and a thermal control circuit, which is paired with the functional block, are provided, the consumed power of the thermal control circuit is regulated by the output operation frequency of each of the functional blocks, and the sum of the heating value of each functional block and the heating value of the thermal control circuit paired with the functional block can be always kept constant, permitting the heating value of the whole LSI to be always kept constant independently of a change in test frequency.

In the prior art, the value of the differentially varied frequency should be previously described as a part of a test program after calculation, or alternatively the test apparatus should be loaded with a complex computing circuit to automatically provide the differentially varied frequency, whereas use of the thermal control circuit according to the present invention advantageously enables the thermal control to be simply performed without description in the test problem.

Further, in the prior art, the circuit size of the dummy circuit is so large that the utilization efficiency of the gate array circuit is low, whereas use of the thermal control circuit according to the present invention can advantageously enhance the utilization efficiency of the gate array circuit.

BRIEF DESCRIPTION OF THE DRAWINGS

The invention will be explained in more detail in conjunction with appended drawings, wherein:

FIG. 2A is a timing diagram of a conventional differentially varied signal $P_{CLK}$;

FIG. 2B is a timing diagram showing any given enlarged section of the test pattern shown in FIG. 2A;

FIG. 8 is a diagram showing a variant of the layout shown in FIG. 7.

DESCRIPTION OF THE PREFERRED EMBODIMENTS

Embodiments of the apparatus for testing a semiconductor IC according to the present invention will be explained in more detail.

Figure 1:
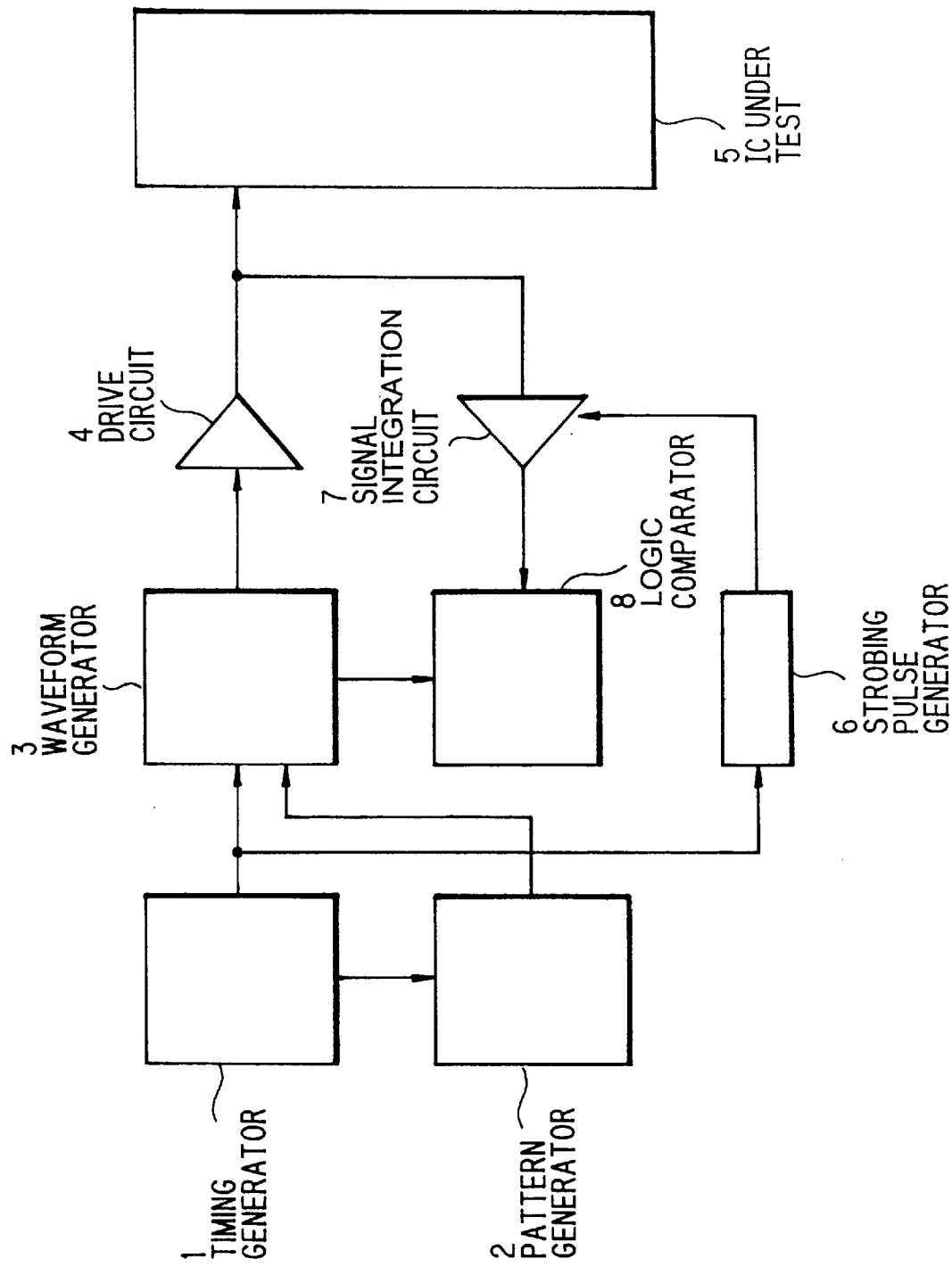
FIG. 1 is a block diagram showing a conventional apparatus for testing a semiconductor IC.

(First preferred embodiment) As shown in FIG. 1, the test apparatus according to a first preferred embodiment of the present invention comprises: a timing generator 1 for generating timing of a signal for testing IC 5 under test; a pattern generator 2 for generating a test pattern, for testing the IC 5 under test, utilizing as an input the timing signal from the timing generator 1; a waveform generator 3 for forming a waveform utilizing as an input the timing signal from the timing generator 1 and the pattern signal from the pattern generator 2; a drive circuit 4 for converting the signal generated in the waveform generator 3 to a voltage; an IC 5 under test which is tested by receiving as an input a signal driven by the drive circuit 4; a signal integration circuit 7 for receiving a signal output from the IC 5 under test and conducting level comparison with an expected value (not shown) utilizing an STRB signal generated by a strobing pulse generator 6 based on the timing signal generated in the timing generator 1; and a logic comparator 8 for conducting logic comparison of a comparison result signal generated in the signal incorporation circuit 7 with an expected value pattern signal generated in the waveform generator 3 and making a judgement such that, when both the logics agree with each other, the IC is acceptable while, when both the logics disagree with each other, the IC is unacceptable.

In this case, an LSI, such as CMOS-G/A, constitutes an electronic circuit comprising a set of a waveform generator 3, a strobing pulse generator 6, and a logic comparator 8, and the number of the electronic circuits corresponds to the number of terminals of IC 5 under test.

An embodiment of the operation of the waveform generator 3 will be described below. As shown in FIGS. 2A and 2B, the signals $D_B$ and $P_{EOR}$ are a timing signal generated in the timing generator 1, the signal $P_{INH}$ a pattern signal generated in the pattern generator 2, and the signal $O_{OUT}$ an output signal from the waveform generator 3.

In the example shown in FIG. 2B, the signal $D_B$ is set by two sets of timing preset values, one set consisting of value ①, ②, and ⑥ with the other set consisting of values ③, ④ and ⑤. Thus, a plurality of timing preset values can be set in clock cycles.

The signal $P_{EOR}$ is a signal which conducts exclusive "OR" operation of the waveform of the signal $D_B$ to add qualifications and the signal $P_{INH}$ is a signal which further ANDs the results of the above logical operation.

Figure 3:
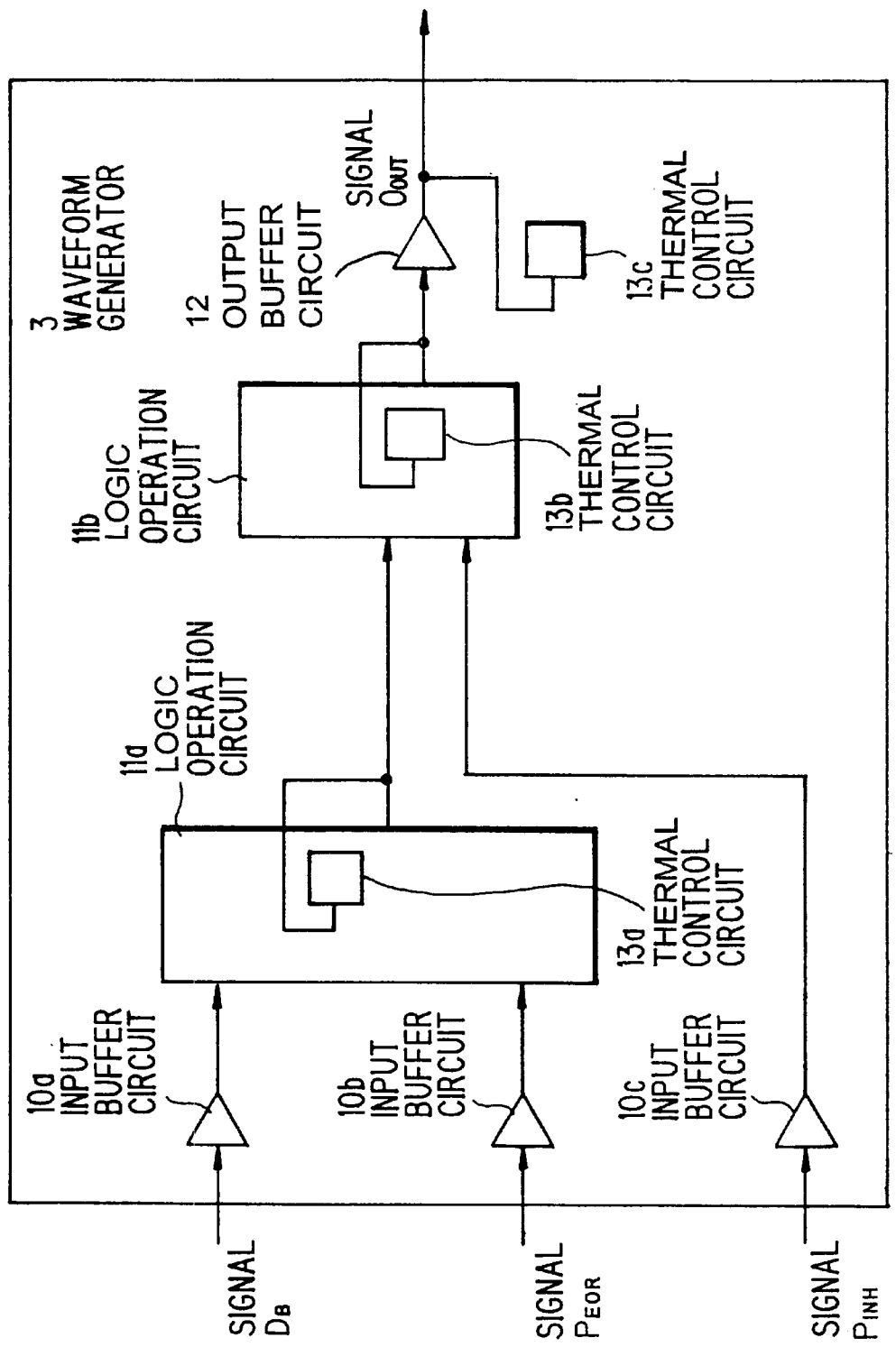
FIG. 3 is a block diagram showing a waveform generator according to a first preferred embodiment of the present invention.

As shown in FIG. 3, the waveform generator 3 in the apparatus for testing a semiconductor IC according to a first preferred embodiment of the present invention comprises thermal control circuits 13a, 13b, and 13c which are so paired with the logic operation circuits 11a and 11b as each functional block. Further, the thermal control circuits 13a, 13b and 13c are constructed so that the consumed power is regulated by the output operation frequency of the logic operation circuits 11a and 11b.

An embodiment of the operation of the waveform generator 3 for one terminal among the electronic circuits in the LSI according to the present invention will be described as a typical example. FIG. 3 is a block diagram of a waveform generator 3 showing a first preferred embodiment of the present invention.

In FIG. 3, the signals $D_B$ and $P_{EOR}$ are inputted through an input buffer circuit 10a and an input buffer circuit 10b into the logic operation circuit 11a which conducts logic operation according to an operation expression and outputs the results of the logic operation.

A signal of the results of the logic operation in the logic operation circuit 11a and the signal $P_{INH}$ through an input buffer circuit 10c are inputted into the logic operation circuit 11b which conducts logic operation according to an operation expression and outputs signal $O_{OUT}$ as the results of the logic operation through an output buffer circuit 12.

The consumed power of the thermal control circuit 13a is regulated by the output operation frequency of the logic operation circuit 11a, the consumed power of the thermal control circuit 13b is regulated by the output operation frequency of the logic operation circuit 11b, and the consumed power of the thermal control circuit 13c is regulated by the output operation frequency of the output buffer circuit 12, permitting the sum of the heating value of each functional block and the heating value of the thermal control circuit paired with the functional block to be always kept constant.

An example thereof will be described. The waveform generator 3 shown in FIG. 1, when expressed in terms of consumed power generating sections in the equation 2, comprises three functional blocks, an input buffer circuit, a logic operation circuit, and an output buffer circuit. Further, the logic operation circuit 11a and the logic operation circuit 11b have been separately expressed in consideration of the fact that the output operation frequency of the logical operation circuit 11a is different from the output operation frequency of the logic operation circuit 11b.

As is apparent from the equation 2, the consumed power of the output buffer circuit (several 100 mW) is incomparably larger than that of the input buffer circuit (several mW), and the consumed power of the input buffer circuit is on a negligible order.

On the other hand, for the logic operation circuit, the number of internal cells amounts to several hundreds to several thousands, and, in the case of an operation frequency exceeding 50 MHz, the consumed power is on a level equivalent to that of the output buffer circuit (several 100 mW).

Regarding the consumed power of a CMOS-IC in an energized state, in an operation frequency exceeding 50 MHz, the consumed power in an unenergized state occupies an incomparably small proportion and, further, is constant independently of the operation frequency. Therefore, the description thereof will be omitted below.

For this reason, an embodiment of the operation will be described which enables the sum of the heating value of each of the logic operation circuit 11a, the logic operation circuit 11b, and the output buffer circuit 12 and the heating value of the thermal control circuit in pair with each of these circuits to be kept constant.

Figure 4:
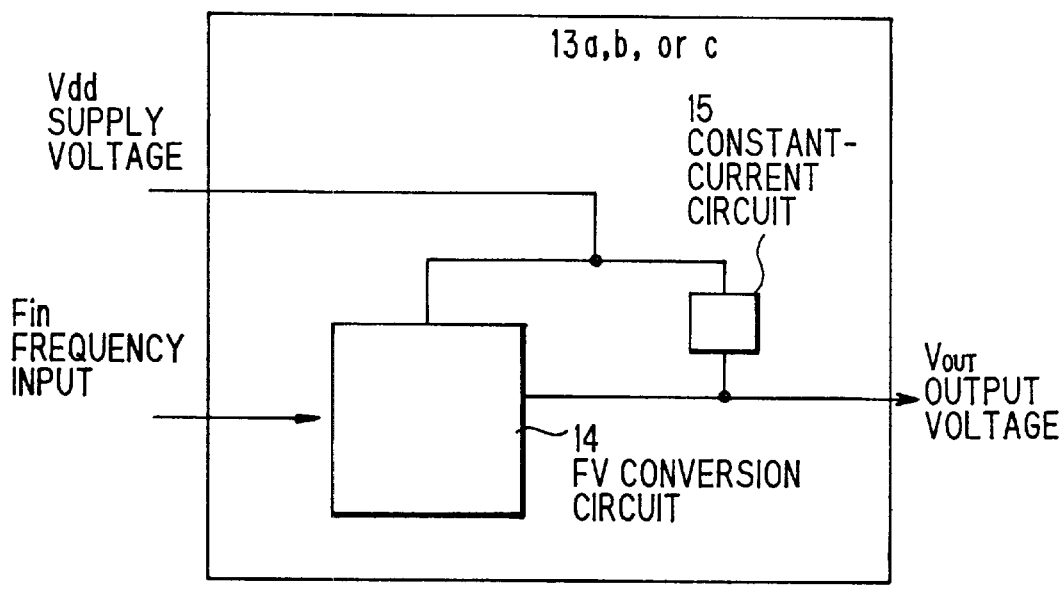
FIG. 4 is a block diagram showing a thermal control circuit according to a first preferred embodiment of the present invention.

FIG. 4 is a block diagram showing thermal control circuits 13a, 13b and 13c. An FV conversion circuit 14, upon input of a frequency input Fin thereinto, outputs an output voltage vout proportional to the frequency. A constant-current circuit 15 is constructed between the supply voltage Vdd and the output voltage Vout, and, hence, the consumed power of the constant-current circuit 15 can be expressed by the product of a voltage difference between the supply voltage Vdd and the output voltage Vout by the current flowing through the constant-current circuit 15.

Figure 5:
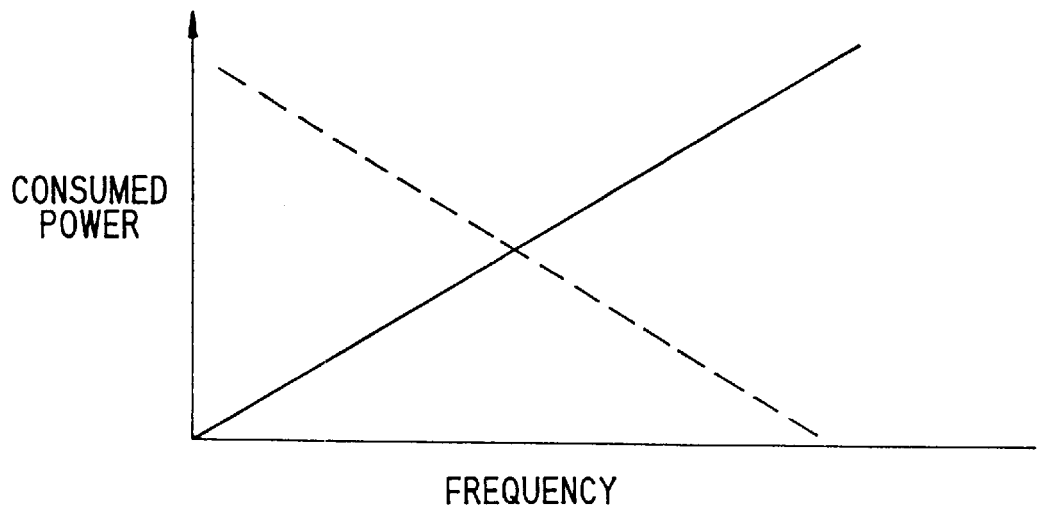
FIG. 5 is a diagram showing the consumed power of a logic operation circuit and a thermal control circuit according to a first preferred embodiment of the present invention.

The consumed power created in the logic operation circuit 11a and the thermal control circuit 13a will be summarized in FIG. 5. In FIG. 5, the ordinate represents the consumed power, and the abscissa represents the frequency. In the drawing, a solid line extended in the top right direction represents the consumed power of the logic operation circuit 11a, while a solid line extended in the right bottom direction represents the consumed power of the thermal control circuit 13a.

The value of the constant-current circuit 15 in the thermal control circuit 13a is determined so that the sum of the consumed power of the logic operation circuit 11a and the consumed power of the thermal control circuit 13a is always kept constant. Strictly speaking, although the operating current of the FV conversion circuit 14 is small, it is not, in some cases, negligible. In this case, the value of the constant-current circuit 15 should be corrected, Further, in an operation frequency exceeding 50 MHz, the consumed power in an unenergized state occupies only an incomparably small proportion and, hence, is negligible.

Figure 6:
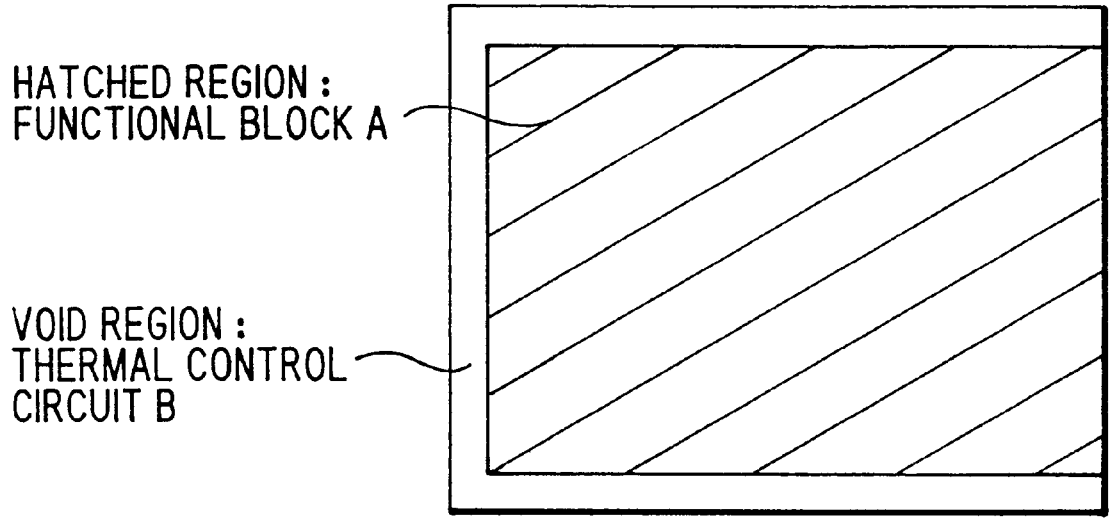
FIG. 6 is a diagram showing a first preferred embodiment of the present invention wherein a thermal control circuit is paired with each functional block.

Next, with reference to FIG. 6, an embodiment will be described wherein a thermal control circuit is physically and electronically paired with each functional block. In FIG. 6, the hatched region represents a functional block A, and the void region represents a thermal control circuit B. As shown in FIG. 6, the thermal control circuit B is laid out so as to adjoin and surround the functional block A, such as the logic operation circuit 11a and the logic operation circuit 11b, thereby permitting mutual heat exchange to be smoothly performed to rapidly equalize the temperature.

Figure 7:
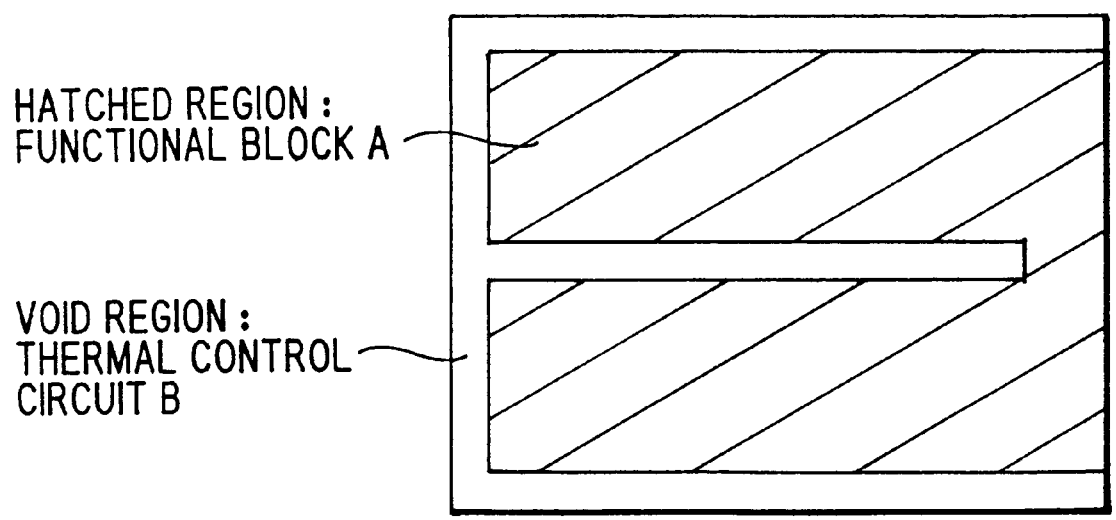
FIG. 7 is a diagram showing a second preferred embodiment of the present invention wherein a thermal control circuit and a functional block are laid out so that the thermal control circuit adjoins and surrounds the functional block in a comb form.

(Second preferred embodiment) FIG. 7 is a diagram showing a second preferred embodiment of the present invention. As described above, according to the first preferred embodiment of the present invention, the thermal control circuit and the functional block are constructed and laid out so that the thermal control circuit adjoins and surrounds the functional block in a box form. On the other hand, according to the second preferred embodiment of the present invention, the thermal control circuit B and the functional block A are laid out so that the thermal control circuit B adjoins and surrounds the functional block A in a comb form. The second preferred embodiment has the effect of offering further smooth heat exchange and temperature equalization.

The thermal control circuit B shown in FIG. 7 has three tines. A further improvement in the effect can be expected by increasing the number of tines. As shown in FIG. 8, constant-current circuits 15-1, 15-2 and 15-3 are laid out in respective tine sections.

As described above, according to the present invention, each functional block within a semiconductor chip constituting an LSI and a thermal control circuit, which is paired with the functional block, are provided, the consumed power of the thermal control circuit is regulated by the output operation frequency of each of the functional blocks, and the sum of the heating value of each functional block and the heating value of the thermal control circuit in paired with the functional block can be always kept constant, permitting the timing accuracy to be stabilized independently of a change in test conditions including test frequency and test pattern.

Further, in the prior art wherein the value of the differentially varied frequency should be previously described as a part of a test program after calculation, or alternatively the apparatus should be loaded with a complex computing circuit to automatically provide the differentially varied frequency, whereas use of the thermal control circuit according to the present invention advantageously enables the thermal control to be simply performed without description in the test problem.

Further, in the prior art, the circuit size of the dummy circuit is so large that the utilization efficiency of the gate array circuit is low, whereas use of the thermal control circuit according to the present invention can advantageously enhance the utilization efficiency of the gate array circuit, Thus, according to the present invention, a CMOS type LSI, which is less expensive, of higher integration density, and lower consumed power as compared with the LSI used in the prior art, can be adopted, offering an advantage that it is possible to provide an apparatus for testing a semiconductor IC which, even when test conditions, including test frequency and test pattern, are varied, can stabilize and ensure the timing accuracy while reducing the cost, consumed power and size of the apparatus.

The invention has been described in detail with particular reference to preferred embodiments, but it will be understood that variations and modifications can be effected within the scope of the invention as set forth in the appended claims.

What is claimed is:

1. An apparatus for testing a semiconductor IC, comprising:
   CMOS type LSIs in a number corresponding to the number of terminals of the semiconductor IC,
   each of said LSIs having a waveform generator, a strobing pulse generator, and a logic comparator,
   at least one of the waveform generator, the strobing pulse generator, and the logic comparator being constructed as a functional block physically and electronically paired with a thermal control circuit thereby permitting mutual heat exchange therebetween,
   the power consumption of the thermal control circuit being regulated by an output operating frequency of the functional block.

2. The apparatus as defined in claim 1, wherein the thermal control circuit comprises an FV conversion circuit for outputting a conversion voltage corresponding to an input frequency, and a constant-current circuit to which a voltage equal to a difference between a supply voltage and the conversion voltage is applied.

3. The apparatus according to claim 1, wherein the thermal control circuit physically adjoins and surrounds the functional block in a box form.

4. The apparatus according to claim 1, wherein the thermal control circuit physically adjoins and surrounds the functional block in a comb form having a plurality of tine sections, and a constant-current circuit is provided in each tine section.

* * * * *